United States Patent [19]

Shibata

[11] Patent Number: 4,830,971
[45] Date of Patent: * May 16, 1989

[54] METHOD FOR MANUFACTURING A SEMICONDUCTOR DEVICE UTILIZING SELF-ALIGNED CONTACT REGIONS

[75] Inventor: Tadashi Shibata, Yokohama, Japan

[73] Assignee: Tokyo Shibaura Denki Kabushiki Kaisha, Kawasaki, Japan

[*] Notice: The portion of the term of this patent subsequent to Nov. 18, 2003 has been disclaimed.

[21] Appl. No.: 832,647

[22] Filed: Feb. 25, 1986

Related U.S. Application Data

[63] Continuation of Ser. No. 645,536, Aug. 29, 1984, Pat. No. 4,622,735, which is a continuation of Ser. No. 328,533, Dec. 8, 1981, abandoned.

[30] Foreign Application Priority Data

Dec. 12, 1980 [JP] Japan .................... 55-174653
Jan. 26, 1981 [JP] Japan ...................... 56-9085
Jan. 26, 1981 [JP] Japan ...................... 56-9087
Jul. 28, 1981 [JP] Japan .................... 56-117052

[51] Int. Cl.$^4$ .................... H01L 21/28; H01L 21/306
[52] U.S. Cl. .................... 437/29; 148/DIG. 19; 148/DIG. 106; 148/DIG. 141; 148/DIG. 156; 156/643; 156/652; 156/653; 156/664; 357/15; 357/71; 437/187; 437/200; 437/203; 437/913
[58] Field of Search ............ 437/29, 200, 203, 913, 437/187; 148/DIG. 19, DIG. 106, 141, 156; 156/643, 652, 653, 664; 357/15, 71

[56] References Cited

U.S. PATENT DOCUMENTS

| | | | |
|---|---|---|---|
| 3,958,323 | 5/1976 | De La Moneda | 29/571 |
| 4,069,067 | 1/1978 | Ichinohe | 148/1.5 |
| 4,074,300 | 2/1978 | Sakai et al. | 357/55 X |
| 4,080,719 | 3/1978 | Wilting | 29/571 |
| 4,085,498 | 4/1978 | Rideout | 29/571 |
| 4,141,022 | 2/1979 | Sigg et al. | 357/23 |
| 4,210,993 | 7/1980 | Sunami | 29/571 |
| 4,221,044 | 9/1980 | Godejahn et al. | 29/571 |
| 4,224,733 | 9/1980 | Spadea | 29/571 |
| 4,287,661 | 9/1981 | Stoffel | 29/571 |
| 4,330,931 | 5/1982 | Liv | 29/578 X |
| 4,356,040 | 10/1982 | Fu et al. | 148/1.5 |

FOREIGN PATENT DOCUMENTS

2358750 7/1977 France .

OTHER PUBLICATIONS

Kircher et al., "Interconnection Method for Integrated Circuit" I.B.M. Tech. Discl. Bull., vol. 13, No. 2, Jul. 1970, p. 436.

I.B.M. Tech. Discl. Bull., vol. 21, No. 3, Aug. 1978, pp. 2150-2151.

Nikkei Electronics, Sep. 1, 1980, pp. 62-65.

Primary Examiner—William G. Saba
Attorney, Agent, or Firm—Oblon, Fisher, Spivak, McClelland & Maier

[57] ABSTRACT

A method for manufacturing a semiconductor device of the invention comprises the steps of (a) forming a gate insulating film on a surface of a silicon substrate, and a gate electrode on said gate insulating film;

(b) forming a source region and a drain region by doping said substrate with an impurity which has a conductivity type opposite to a conductivity type of said silicon substrate;

(c) forming a self-aligned insulating layer on the side walls of the gate electrode;

(d) forming a self-aligned metal layer on a region on which an insulating film is not formed, the region including the source region and the drain region; and (e) forming electrodes which are connected to the source region, drain region and gate electrode.

9 Claims, 6 Drawing Sheets

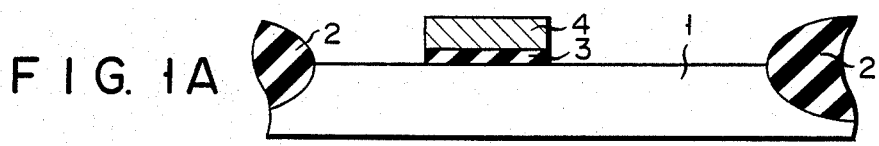
F I G. 1A
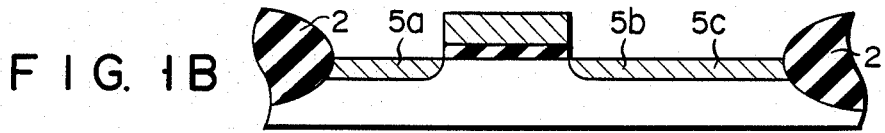
F I G. 1B
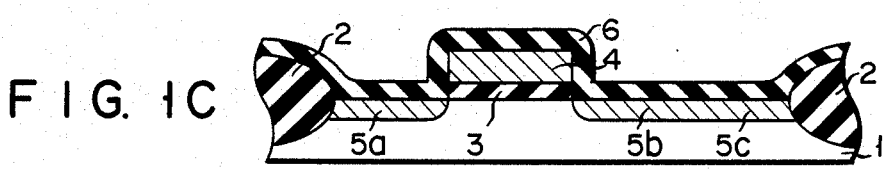
F I G. 1C
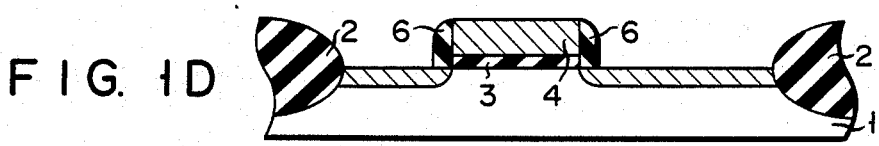
F I G. 1D
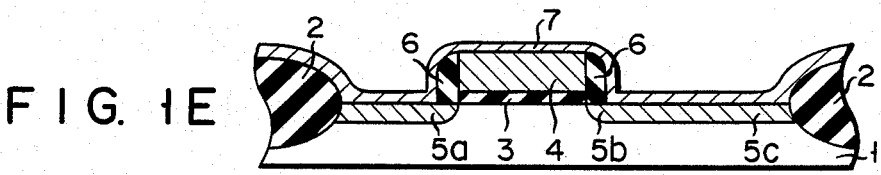
F I G. 1E
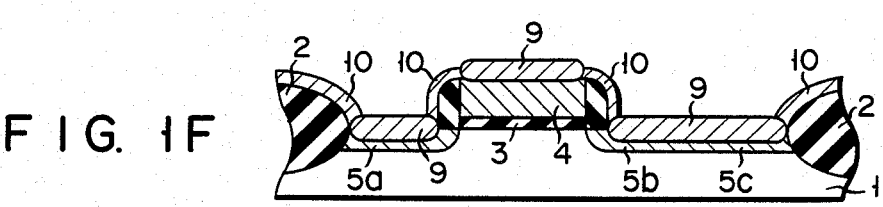
F I G. 1F
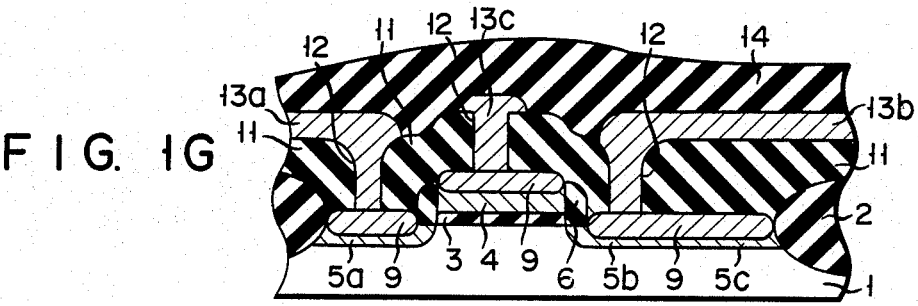
F I G. 1G

METHOD FOR MANUFACTURING A SEMICONDUCTOR DEVICE UTILIZING SELF-ALIGNED CONTACT REGIONS

This application is a continuation of U.S. patent application Ser. No. 06/645,536 filed Aug. 29, 1984, which issued as U.S. Pat. No. 4,622,735, which was a continuation of U.S. Application Ser. No. 06/328,533 filed Dec. 8, 1981, now abondoned.

BACKGROUND OF THE INVENTION

1. Field of the Invention

The present invention relates to a method for manufacturing a semiconductor device and, more particularly, to a method for manufacturing a semiconductor device of MIS (metal insulator semiconductor) type with high speed and high integration density.

2. Description of the Prior Art

The integration density of integrated circuits is ccontinuously increasing. Especially, ultra LSIs are being studied and developed. In order to increase the integration density of the integrated circuits, the elements which constitute an integrated circuit must be made small. However, when an MOS transistor is made small, especially when the channel length thereof is shortened, a short channel effect occurs, extremely decreasing the threshold voltage of the transistor. This effect occurs due to extension of a depletion layer into a channel region so that the charge of the channel region is greatly influenced by the drain voltage as well as the gate voltage.

In order to prevent the short channel effect, an impurity is ion-implanted in the channel region to increase the impurity concentration of the channel region to avoid extension of the depletion layer. Alternatively, the thickness of the gate oxide film is made small to increase the influence of an electric field of the gate electrode. Furthermore, it is possible to prevent extension of the depletion layer into the channel region by making the diffusion depth (Xj) of the source and drain regions small enough to prevent the short channel effect. However, when the diffusion depth (Xj) is made small, the resistivities of the source region, the drain region, and the interconnection layer constituted by the diffusion layer increases, because source, drain and interconnection layer are usually formed simultaneously by forming diffused layers. Further, the reduction of the interconnection layer width due to the scaling-down of devices increases the total resistance of interconnect. Therefore, the operation speed of the circuit is extremely reduced. When a shallow p-n junction is formed and the extension of the depletion layer ihto the channel region is controlled, the reverse breakdown voltage of the drain p-n junction is reduced due to so-called "surface breakdown", so that a power supply voltage cannot be increased.

SUMMARY OF THE INVENTION

It is an object of the present invention to provide a method for manufacturing a semiconductor device which prevents the short channel effect caused by a proportional reduction of elements in size, which does not prevent high integration density, and which performs high speed operation and has a high reverse breakdown voltage.

In order to achieve the above and other objects of the present invention, there is provided a method for manufacturing a semiconductor device comprising the steps of (a) forming a gate insulating film on a surface of a silicon substrate, and a gate electrode on said gate insulating film, (b) forming a self-aligned insulating film at least on a side wall of said gate electrode, (c) forming self-aligned metal films or metal siliiide films on a region in which an insulating film is not formed and which includes a source region, a drain region and an interconnection region which is an extended part of said source region or drain region or both, or prospective regions in which said source, drain and interconnection regions are to be formed, and (d) forming said source region, said drain region, and said interconnection region which is an extended part of said source region or drain region or both by diffusing at least one time after step (a) an impurity which is of a conductivity type opposite to that of said silicon substrate.

According to the present invention, the short channel effect is prevented by a shallow junction depth Xj, while high integration density is maintained. Further, the source region, the drain region and the interconnection region are formed to have a low sheet resistivity so that delay of an input and output signal is prevented and the surface breakdown voltage is also increased.

When a mask processing step for patterning a metal or metal silicide is added, room for mask alignment must be consieered so that the integration density is reduced. However, according to the present invention, the metal or metal silicide film is formed by self-alignment relative to the gate electrode so that high integration density is accomplished. In particular, the size of an element of 0.7 to 1 $\mu$ may be reduced. Therefore, mask misalignment does not occur, accomplishing formation of low resistance layers having constant resistance, and providing easy control of the transistor characteristics.

BRIEF DESCRIPTION OF THE DRAWINGS

FIGS. 1A to 1G are cross-sectional views illustrating a process of Example 1 according to the present invention;

DETAILED DESCRIPTION OF THE PREFERRED EMBODIMENTS

Figure 2:
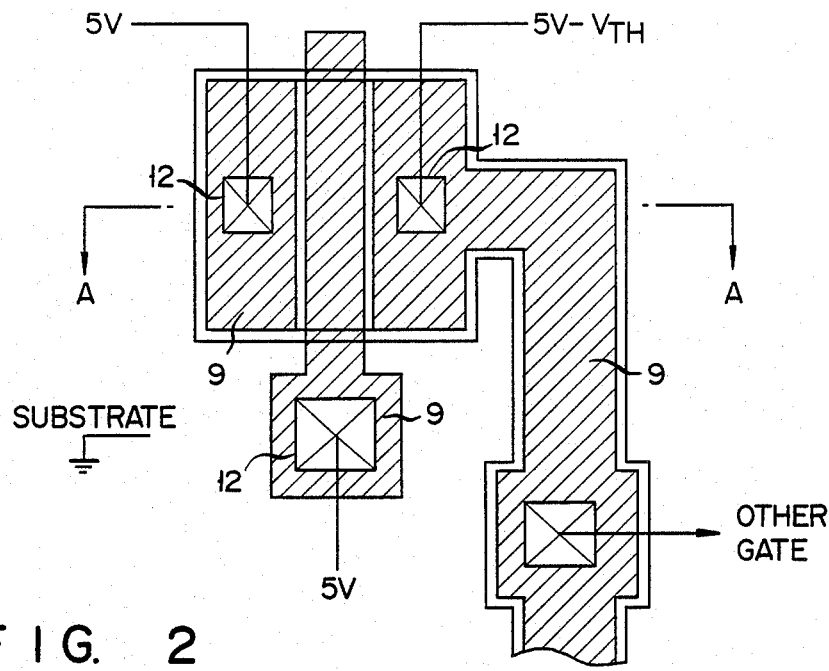
FIG. 2 is a plan view of an MOS transistor of Example 1 according to the present invention.

A method for manufacturing a semiconductor device according to the present invention will be described in detail.

A field oxide film, a gate oxide film and a gate electrode are sequentially formed on a silicon substrate by a conventional method. The silicon substrate may comprise a p-type silicon substrate, an n-type silicon substrate, a silicon substrate with n-type and p-type silicon formed thereon as, for example a CMOS, an amorphous substrate with recrystallized polycrystalline silicon or monocrystalline silicon formed thereon, or an SOS structure. In other words, the silicon substrate need comprise one on the surface of which silicon exists. The gate electrode may be formed by metal, metal silicide, or polycrystalline silicon including an impurity such as As, P, B and so on, or it may be a two-layer structure consisting of metal silicide and polycrystalline silicon. The gate electrode may be formed by undoped polycrystalline silicon, and an impurity may be diffused when the source and drain regions are formed.

Next, an impurity of opposite conductivity type to that of the silicon substrate is diffused in this step as needed. As a result, a source region, a drain region and a diffusion interconnection region as an extended part of at least one of these regions are formed. The impurity may be selected from As, B, Al, P and so on which have opposite conductivity to what of the substrate. The dose of the impurity is generally $1 \times 10^{14}$ cm$^{-2}$. However, a high dose of more than $1 \times 10^{16}$ cm$^{-2}$ or a low dose of less than $1 \times 10^{14}$ cm$^{-2}$ may be applied as needed. When an impurity is ion-implanted, annealing is generally subsequently performed. The annealing is performed by a method in which the substrate is annealed by heating in an N$_2$ atmosphere or an oxidation atmosphere, by laser annealing, by electron beam annealing or the like. The impurity may be implanted into the silioon substrate directly or through on oxide film. The impurity may be diffused anytime throughout the process. Furthermore, the impurity may be diffused in separate steps at least two times.

A self-aligned insulating film is formed only on side walls of the gate electrode or on a surface of the gate electrode. In order to form the self-aligned insulating film only on the side walls of the gate electrode, a vapor growth method, for example a CVD method, is used to deposit the insulating film on the gate electrode, and an anisotropic etching method such as reactive ion etching, sputtering etching or the like is used to etch the insulating film. As a result, the insulating film remains only on the side walls of the gate electrode, while the surfaces of the source region, the drain region and the diffusion interconnection region, and the upper surface of gate electrode are exposed. In this case, an organic polymer film may be formed on the exposed silicon substrate or a number of crystal defects may be formed on the surface layer to a thickness of about 100 Å after the reactive ion etching or the sputtering etching is performed. When the next step is performed, that is, when a metal film or a metal silicide film is formed while the crystal defects and the organic polymer film are le-tf, the metal film or metal silicide film may be nonuniform. In order to avoid this problem, on the surface of the wafer after the reactive ion etching or sputtering etching is performed, an O$_2$ plasma treatment, a dilute HF treatment, a CF$_4$ plasma treatment, a wet treatment using H$_2$O$_2$ and H$_2$SO$_4$ or the like, or a combination thereof, as needed, is performed to improve the uniformity of the metal or metal silicide film. Further, after the insulating film is deposited by vapor growth on the entire surface of the silicon substrate, phosphorous gettering may be performed in an atmosphere containing POCl$_3$ at a temperature, for example, of 1,000° C. before etching. In this case, mobile ions such as Na which are present in the gate oxide film and other insulating films are deactivated so that the reliability of the elements is increased, and heavy metals or the like in the silicon substrate are eliminated to improve the p-n junction characteristics. Furthermore, the above-mentioned annealing may be omitted and the impurity which is implanted may be activated in the gettering step. Therefore, a shallower p-n junction may be formed.

A method for forming the self-aligned insulating film only on the surface of the gate electrode, that is, the side walls and the upper surface of the gate electrode, will be described below. Polycrystalline silicon, which is doped with an impurity (n-type) of high concentration of, for example $1 \times$ cm$^{-2}$ or more, is used as the gate electrode. The gate electrode is oxidized in a wet atmosphere at a temperature of, for example, 950° C. or less. However, in this case, the diffusion of an impurity of high dose of $1 \times 10^{14}$ cm$^{-2}$ or more in the silicon substrate described above must not be performed at this stage yet. As a result of oxidation, a thick oxide film is formed on the surface of the gate electrode containing an impurity of high concentration, while only a thin oxide film is formed on the surface of the silicon substrate in which an impurity of high concentration is not doped. When this thin oxide film is etched, the prospective source, drain and diffusion interconnection regions are exposed, while the surface of the gate electrode is entirely covered with the oxide film.

As a material which covers at least side walls of the gate electrode, SiO$_2$ is utilized. However, the material is not limited to this, but may be extended to an insulating material such as Si$_3$N$_4$ or alumina.

A self-aligned metal film or metal silicide film is formed on the silicon region where the insulating film is not formed, to a thickness of, for example, 500 to 2,000 Å. A method for forming a metal silicide film is first described. A metal is deposited on the entire surface of the silicon wafer and thermal annealing is performed. The metal silicide is produced only at positions where the metal and silicon come in contact. As a result, a metal silicide film is formed on the source region, the drain region, and the diffusion interconnection region and may be formed on the upper surface of the gate electrode. The metal which is deposited on the field oxide film and the side walls of the gate electrode may easily be eliminated by, for example, an acid treatment. Metals such as W, Pd, Pt, Ni, Mo, Nb, Ta, and Ir which react with silicon to produce a stable silicide film may be used. Pt is easy to use for this purpose.

Formation of the metal silicide film may be performed by irradiation by a laser beam after the metal is deposited, instead of thermal annealing. For example, after the metal is deposited, the silicon region may be scanned with the laser beam once at an output of about 10 W by using a CW-Ar laser so that the same results as in annealing described above may be obtained. The method in which the laser beam is used has advantages in that the temperature of the wafer is not made high. Further, when the laser beam is used, it may be selectively radiated on only predetermined spots so that the metal silicide film may be selectively formed. In this case, the insulating material on the side faces of the gate electrode prevents thermal conduction between the desired metal silicide layer and the gate electrode. The same effect may be obtained when a CW electron beam is used instead of the laser beam. Further, the metal silicide layer may be formed by ion-implanting an impurity, for example Ar, at an interface of the metal layer with the silicon or into the silicon substrate after the metal is deposited. This method is called "ion beam mixing". According to this method, even if a thin oxide film (at a thickness of, for example, 10 to 20 Å) or contaminant such as carbon derived from a vacuum pumping system remains on the surface of the silicon wafer before the metal is deposited, the stable metal silicide layer is easily formed by reacting the metal and the silicon. Therefore, problems such as nonuniform formation of the metal silicide layer due to the presence of the thin oxide film or contaminant, high contact resistance between the metal silicide layer and the silicon layer, and the like are eliminated. Therefore the yield of the wafers increases by about 10 to 20% as compared with a method according to thermal annealing. The impurity here is not limited to Ar, and other impurities such as As, Si and Xe may be used. Furthermore, since the ion beam mixing method does not necessarily require a heating process, in the MIS semiconductor device which is produced in a proportional-reduced scale, a shallow low resistance layer may be formed. According to the ion beam mixing method, the metal silicide layer and simultaneously the source, drain and diffusion interconnection layers are formed by using an impurity of opposite conductivity type to that of the silicon substrate. In addition to this, when Pd is used as the metal, more PdSi is formed than $Pd_2Si$. Therefore, this method has an advantage in that the silicide layer is formed having a resistivity which is $\frac{2}{3}$ to $\frac{1}{2}$ the resistivity of the silicide layer obtained by thermal annealing. By performing the annealing after the ion beam mixing is performed and before the unreacted metal film is eliminated, the silicidation reaction may be promoted and the thickness of the metal silicide layer may be increased. Thermal annealing, CW laser beam irradiation, CW electron beam irradiation or the like may be used for annealing. Since the annealing after the ion beam mixing and after or before the removal of the unreacted metal film is effective towards improvement of crystallizability of metal silicide and lowering of resistivity of the diffusion regions, it is desirable to perform such annealing.

Formation of the self-aligned metal film on the silicon region on which the insulating film is not formed will be described. The wafer is heated at a temperature below the temperature at which the silicon and the metal are alloyed under reduced pressure, while a metal halide gas and a reducing gas are introduced, so that a metal layer is selectively formed on the exposed silicon region only. A metal such as W, Pd, Pt, Ni, Mo, Nb, Ta or other metals which may be deposited on the silicon layer by the halide reduction may be used for the metal here. For example, W or Mo may be deposited on the silicon layer by using a gas mixture of $WF_6$ or $MoF_6$ and $H_2$.

After the self-aligned metal film or metal silicide film is formed on the silicon region which is exposed and on which the insulating film is not formed, the insulating film which is formed on the side walls of the gate electrode may be eliminated and an impurity of opposite conductivity type to that of the silicon substrate may be ion-implanted. The source region, the drain region and the diffusion interconnection region may thus be formed. In the method in which the metal silicide layer is formed after the impurity is ion-implanted, oil of a vacuum pump is ionized by accelerated ions so that the oil ions become attached to the surface of the silicon substrate to form a carbon film. The carbon film is not sufficiently eliminated in a cleaning process and formation of the metal silicide layer may be impaired. However, in the method in which the impurity is ion-implanted after the metal silicide layer is formed as described above, the problem as described above is eliminated.

Thereafter, the MOS transistor is manufactured in accordance with the general process.

Examples of the present invention will be described in detail.

EXAMPLE 1

Referring to FIG. 1A, a field oxide film 2, a gate oxide film 3, and a phosphorous-doped gate polycrystalline silicon layer 4 were sequentially formed on a p-type silicon substrate 1 of 50 Ω·cm in accordance with the conventional process. An impurity, for example As, was ion-implanted at a dose of $1 \times 10^{14}$ cm$^{-2}$ at an acceleration voltage of 40 KeV to form a source region 5a, a drain region 5b and a diffusion interconnection region 5c (FIG. 1B). An $SiO_2$ film 6 was deposited on the entire surface to a thickness of about 3,000 Å by the vapor growth method (FIG. 1C).

The $SiO_2$ film 6 was etched by about 3,000 Å by reactive ion etching or sputtering etching so that the $SiO_2$ film 6 remained only on the side walls of the gate polycrystalline silicon layer 4. The surfaces of the source region 5a, the drain region 5b and the diffusion interconnection region 5c, and the upper surface of the gate polycrystalline silicon layer 4 were exposed. Then, As was ion-implanted again at a dose of $5 \times 10^{15}$ cm$^{-2}$ at an acceleration voltage of 50 KeV, and thereafter, annealing was performed in an oxidation atmosphere consisting of $O_2$ gas diluted with Ar gas. The oxide film formed on the silicon surface was removed (FIG. 1D). A metal as a refractory metal, for example tungsten, was deposited over the entire surface to a thickness of about 400 Å by vacuum deposition so that a tungsten film 7 was formed. The wafer was then thermal-annealed in an $N_2$ atmosphere at a temperature of, for example, 800° C. for about 1 hour. A silicide formation reaction occurred only in regions where tungsten came in contact with silicon so that a tungsten silicide ($WSi_2$) film 9 was formed over the entire surfaces of the source region 5a, the drain region 5b and the diffusion interconnection region 5c to a thickness of about 1,100 Å. At the same time, the tungsten silicide film 9 was formed on the upper surface of the gate polycrystalline silicon layer 4. A tungsten silicide film 10 on the field oxide film 2 and the side walls of the gate polycrystalline silicon layer 4 were eliminated by an acid treatment (FIG. 1F).

Thereafter, in accordance with the general process for manufacturing conventional MOS transistors, a PSG layer 11, a contact hole 12, and electrodes 13a, 13b and 13c were formed, the electrodes being connected to the source, the drain and the gate and made of aluminum. Finally, a PSG layer 14 as a protective film was formed and perforation for bonding and the like was performed, thus accomplishing the MOS transistor.

FIG. 2 is a plan view of the MOS transistor as described above. The cross sections of FIGS. 1A to 1G correspond to that along the line A—A in FIG. 2. This MOS transistor may be used, for example, as a switching transistor of a memory. That is, when a voltage of 5 V is applied to the gate while a voltage of 5 V is applied to the source from an inverter (not shown) for example, a voltage $5V - V_{TH}$ (threshold voltage) is output from the drain. The output voltage is supplied to a gate of another transistor through the diffusion interconnection layer. The source electrode 13a and the drain electrode 13b as shown in FIG. 1G were, respectively, another input end and output end.

In the MOS transistor which was manufactured by the method as described above, the tungsten silicide film of about 1,100 Å thickness was formed on the source, the drain and the gate so that a sheet resistivity of the source and the drain was about 7 $\Omega/\square$, and a sheet resistivity of the gate was about 5 $\Omega/\square$, which were much lower than the sheet resistivity of 50 $\Omega/\square$ of the diffusion layer according to the conventional method. Therefore, the delay time of a signal at the diffusion interconnection region which extended from the drain (or source) was reduced 80% or more as compared with the diffusion interconnection region according to the conventional method. Although the delay time was influenced by the sheet resistivities of the drain (or source) and diffusion interconnection layer which was the extended part of the drain (or source), in general, the length of the diffusion interconnection layer is greater than that of the source and the drain which are connected thereto, so that the resistivity of the diffusion interconnection layer is higher than that of the drain and the source. Therefore, the effect of forming the metal silicide film on the surface of the diffusion interconnection layer is great. Alternatively, the diffusion interconnection layers may be formed as the extended parts of both the drain and source.

According to the method of the present invention, since the dose of the ion-implantation for forming the source and the drain is independent of the sheet resistivity of the diffusion layer, a small dose of $1 \times 10^{14}$ cm$^{-2}$ was implanted into at least the silicon region in the vicinity of the gate electrode as compared with the dose of $1 \times 10^{15}$ to $1 \times 10^{16}$ cm$^{-2}$ of the conventional method. At most one-tenth of the concentration used in the conventional method was adopted for the example so that the impurity concentration of the source and the drain in the vicinity of an end of the gate would be made low. Therefore, the depletion layer of the drain extended to the substrate side (p-type region) and to the ion-implanted layer side (n-type region), that is, the inside of the p-n junction. As a result, the width of the depletion layer in the vicinity of the drain was made large and the surface breakdown voltage was raised about 4 to 5 V as compared with that in the conventional method. Further, the second ion-implantation performed at 50 KeV may be omitted, and if done so, the capacitance of the depletion layer of the source and the drain was reduced about 40% so that the operation speed of the element increased about 10 to 30%. In this case, the depth of the p-n junction surface was about 2,000 Å from the surface of the silicon substrate, which was less than the depth in the conventional method, 4,000 Å, effectively preventing the short channel effect. In the case that the high breakdown voltage is not required, doses of the source and drain implantation may be increased to the conventional doses of $1 \times 10^{15}$ to $1 \times 10^{16}$ cm$^{-2}$. In this case, the resistances of the source and drain under the SiO$_2$ coverings on side walls of gate poly-silicon are further reduced.

In the example described above, the self-aligned metal silicide layer was formed on the surfaces of the source, drain and interconnection regions and the upper surface of the gate electrode. However, a self-aligned metal layer may be substituted for the self-aligned metal silicide layer with the same effect, as described in example 3.

EXAMPLE 2

Figure 3A:
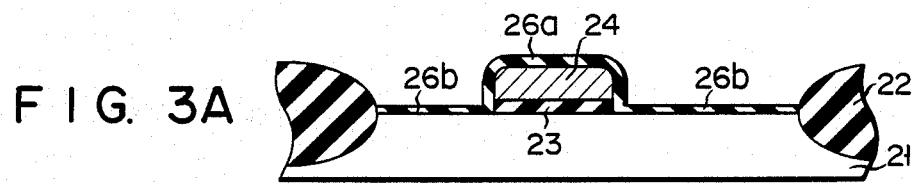
FIGS. 3A to 3C are cross-sectional views of a process of Example 2 according to the present invention.

Referring to FIG. 3A, a field oxide film 22, a gate oxide film 23 and a phosphorus-doped gate polycrystalline silicon layer 24 were sequentially formed on a p-type silicon substrate 21 in accordance with the conventional process. An impurity, phosphorus in this case, was doped at a high dose of $1 \times 10^{23}$ cm$^{-2}$ or more in the polycrystalline silicon layer 24 as the gate electrode. The wafer was then wet-oxidized at a temperature of 900° C. (a temperature of 900° C. or less being appropriate). An oxide film 26a was formed on the surface of the polycrystalline silicon layer 24 to a thickness of about 3,000 Å, while an oxide film 26b was formed on the surface of the silicon substrate 21 to a thickness of only about 1,000 Å. In this condition, the SiO$_2$ film was reduced in thickness by 1,000 Å by etching. The SiO$_2$ film 26a remained on the surface of the gate polycrystalline silicon layer 24 to a thickness of about 2,000 Å, and the prospective source, drain and interconnection regions were exposed.

Figure 3B:
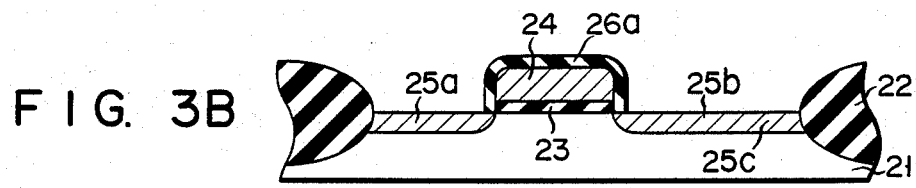
Figure 3C:
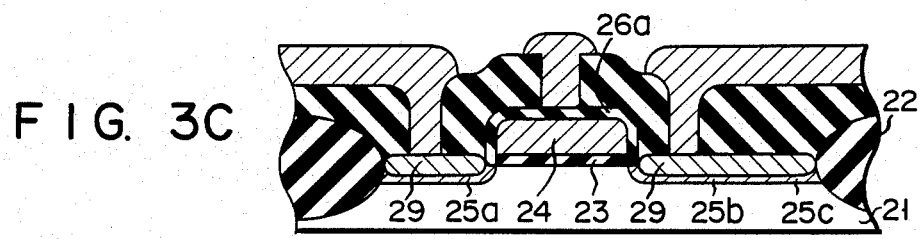

Under the same conditions as in Example 1, arsenic was ion-implanted to form a source region 25a, a drain region 25b and the diffusion interconnection region 25c (FIG. 3B). Tungsten was then evaporated to form a tungsten silicide film 29 in the same manner as in Example 1. Finally, in the same manner as in Example 1, the MOS transistor was manufactured (FIG. 3C).

The difference between the MOS transistor (FIG. 3C) obtained in Example 2 and the MOS transistor (FIG. 1G) obtained in Example 1 was that the metal silicide film was formed on the upper surface of the gate polycrystalline silicon layer in the MOS transistor of Example 1, while this film was not formed on the surface of the gate polycrystalline silicon layer in the MOS transistor of Example 2. However, the gate polycrystalline silicon layer 24 was doped with a high concentration of phosphorous so that a low sheet resistivity of 10 to 15 $\Omega/\square$ was accomplished. Even though the metal silicide film was not formed on the upper surface thereof, no problem occurred. The MOS transistor obtained in Example 2 had the same features as that in Example 1.

In this example also, a metal layer may be substituted for the metal silicide layer.

EXAMPLE 3

Figure 4A:
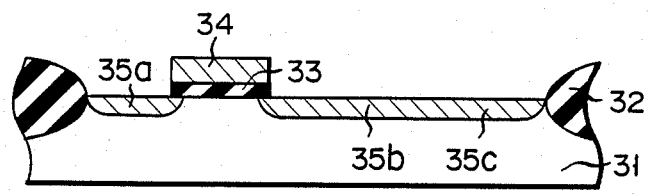
FIGS. 4A to 4E are cross-sectional views of a process of Example 3 according to the present invention.
Figure 4B:
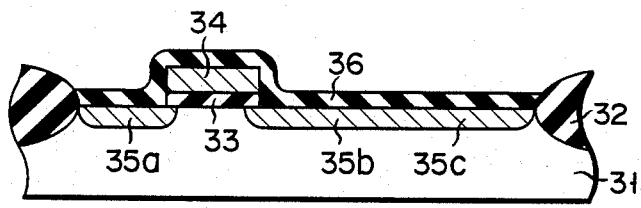

A field oxide film 32, a gate oxide film 33 and a phosphorus-doped gate polycrystalline silicon layer 34 were sequentially formed on a silicon substrate 31 of 50 $\Omega$·cm, in this case, in accordance with the conventional process. An impurity, As in this case, was ion-implanted at a dose of $1 \times 10^{14}$ cm$^{-2}$ and at an acceleration voltage of 40 KeV to form a source region 35a, a drain region 35b and a diffusion interconnection region 35c (FIG. 4A). The wafer was then oxidized in a dry O$_2$ gas atmosphere at a temperature of 1,000° C. for 20 minutes to form a thermal oxide film (SiO$_2$ film) 36 and to electrically activate the ion-implanted arsenic (FIG. 4B).

Figure 4C:
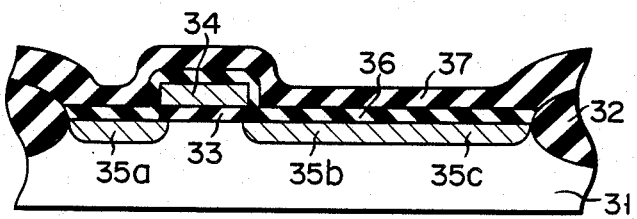
Figure 4D:
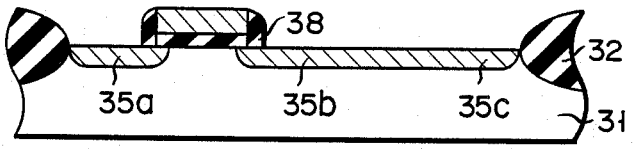
Figure 4E:
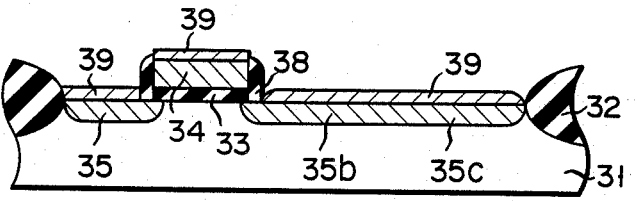

An SiO$_2$ film 37 of about 3,000 Å was formed by the vapor growth method (FIG. 4C). The SiO$_2$ films 36 and 37 were etched by a thickness corresponding to the total thickness thereof by an etching method having directionality (anisotropic etching such as reactive ion etching or sputtering etching being appropriate), so that an SiO$_2$ film 38 remained on the side walls of the gate polycrystalline silicon layer 34. Therefore, the surfaces of the source region 35a, the drain region 35b and the diffusion interconnection region 35c and the upper surface of the gate polycrystalline silicon layer 34 were exposed (FIG. 4D). The wafer was then heated at a temperature of about 400° to 600° C. and exposed to an atmosphere of a gas mixture of $WF_6$ and $H_2$ so that a tungsten film 39 was selectively formed only on the surfaces of the silicon substrate 31 and the polycrystalline silicon layer 34. In this case, the gas pressure was 0.1 to 10 Torr. Alternatively, a reaction chamber may be heated for heating the wafer indirectly instead of directly. In this manner, the tungsten film 39 was formed to cover the source region 35a, the drain region 35b, the diffusion interconnection region 35c and the polycrystalline silicon layer 34 to
a thickness of about 1,100 Å (FIG. 4D).

An MOS transistor was obtained in the same manner as in FIG. 1G except that the tungsten film 39 was formed in place of the tungsten silicide film 9 in accordance with the conventional method for manufacturing the MOS transistor.

In the MOS transistor manufactured by the method as described above, since the tungsten film of about 1,100 Å thickness is formed on the surfaces of the source region and the drain region and the upper surface of the gate electrode, the sheet resistivity thereof is as low as about 1 Ω/□, as compared with the sheet resistivity of about 50 Ω/□ of the diffusion layer according to the conventional method. Therefore, the delay time of the signal in the diffusion interconnection region which extends from the drain (or source) is reduced to about 1/50 the delay time of the conventional method. Other effects are the same as in Example 1. In this example also, the self-aligned metal silicide layer may be used in place of the self-aligned metal layer with the same effects.

EXAMPLE 4

Figure 5A:
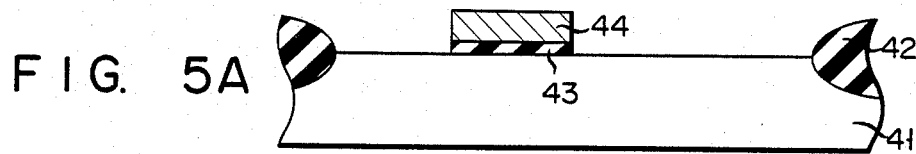
FIGS. 5A to 5E are cross-sectional views of a process of Example 4 according to the present invention.
Figure 5B:
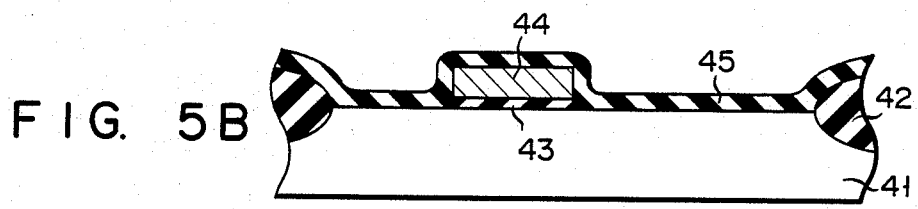
Figure 5C:
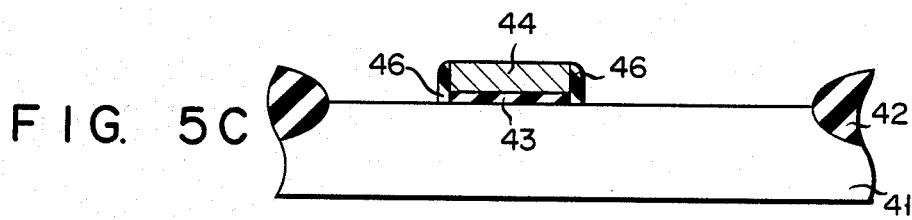

A field oxide film 42, a gate oxide film 43 and a phosphorus-doped polycrystalline film 44 were sequentially formed on a p-type silicon substrate 41 of 50 Ω·cm, in this case, in accordance with the conventional method (FIG. 5A). An $SiO_2$ film 45 was formed over the whole surface to a thickness of 3,000 Å by the CVD method (FIG. 5B). The $SiO_2$ film 45 was etched at a thickness of about 3,000 Å by reactive ion etching or sputtering etching. Therefore, the CVD-$SiO_2$ film 45 remains only on the side walls 46 of the gate polycrystalline silicon layer 44 (FIG. 5C). In this case, an organic polymer film was formed on the etched surface. A crystal defect occured in the vicinity of the etching surface, that is a defect layer in a broad sense was formed. In order to eliminate the organic polymer film and the defect layer, a process for etching the surface layer may be performed at this stage.

Figure 5D:
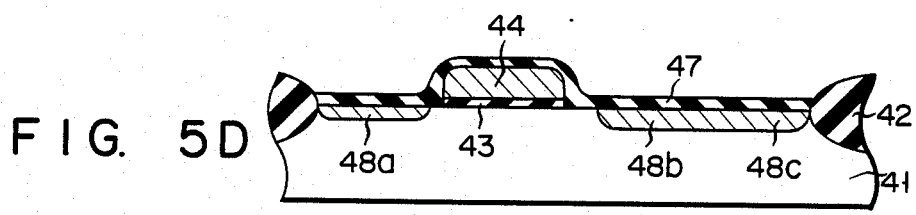
Figure 5E:
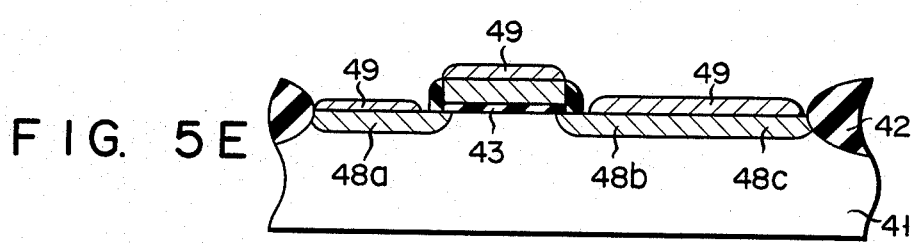

The wafer was oxidized in a dry $O_2$ atmosphere at a temperature of 1,000° C. for about 1 hour to form a thermal oxide film 47 on the upper surfaces of the gate polycrystalline silicon layer 44 and the silicon substrate 41 to a thickness of about 500 Å. An impurity such as As was ion-implanted at a dose of $1 \times 10^{14}$ cm$^{-2}$ and at an acceleration voltage of 100 KeV. Therefore, a source region 48a, a drain region 48b and a diffusion interconnection region 48c connected to the drain region 48b were formed (FIG. 5D). Thereafter, the wafer was heated in an $N_2$ atmosphere at a temperature of 1,000° C. for about 20 minutes so that the ion-implanted As was activated and was diffused in the transverse direction. The end of the diffusion region and the end of the gate polycrystalline silicon layer were aligned as shown in FIG. 5E.

The thermal oxide film 47 was etched and the wafer was heated at a temperature of about 400° to 600° C. The wafer was then placed in a gas mixture of $WF_6$ and $H_2$ so that tungsten was deposited only on the exposed surface of the silicon substrate 41 and on the upper surface of the gate polycrystalline silicon layer 44. In this manner, a tungsten film 49 of about 1,100 Å thickness was formed on the surfaces of the source region 48a, the drain region 48b, the diffusion interconnection region 48c and the gate polycrystalline silicon layer 44 (FIG. 5E).

An MOS transistor was manufactured in the same manner as in the MOS transistor of Example 3 shown in FIG. 1G in accordance with the conventional method for manufacturing the MOS transistor, except that the tungsten film 49 was formed in the predetermined region in place of the tungsten silicide film 9.

In this example, as shown in FIG. 5B, the CVD-$SiO_2$ film 45 was deposited on the entire surface. Before the CVD-$SiO_2$ film 45 is formed, in the same manner as in the formation of the thermal oxide film 36 of Example 3, the wafer may be oxidized in a dry $O_2$ atmosphere at a temperature of 1,000° C. The gate oxide film in the vicinity of the end of the gate electrode may be made thicker than the film in the vicinity of the center of the gate electrode so that the dielectric strength between the gate electrode and the diffusion regions may be increased. Further, the impurity As was ion-implanted through the thermal oxide film 47. However, ion-implantation may be directly performed on the silicon substrate without forming the thermal oxide film. Furthermore, the annealing was performed in the $N_2$ atmosphere after the ion-implantation. However, the annealing may be performed in an atmosphere containing $POCl_3$.

In a method in which the impurity is ion-implanted, before the insulating film is etched, to remain only on the side walls of the gate electrode, the field oxide film 42 on the diffusion interconnection region side may be overetched during etching of the CVD-$SiO_2$ film 45 by reactive ion etching so that the surface of the silicon substrate which is not ion-implanted is exposed and short circuiting occurs between the tungsten film on the exposed surface and the silicon substrate. However, in Example 4, the ion-implantation was performed after reactive ion etching was performed, eliminating the above problem.

In Example 4, the doping of As in the area of the silicon substrate 41, under the CVD-$SiO_2$ film 45 remaining on the side walls of the gate electrode, was performed by diffusion in the transverse direction of As present in the source region 48a and the drain region 48b. However, ion-implantation may be performed at a predetermined dose and acceleration voltage before the CVD-$SiO_2$ film 45 is deposited on the entire surface. In this case, As is ion-implanted twice. The As doping need not be limited to the ion-implantation. Instead of the CVD-$SiO_2$ film 45, an As or P-doped CVD-$SiO_2$ film or an As or P-doped polycrystalline silicon film may be formed, which may be used as the diffusion source so that As may be doped. In this example also, the self-aligned metal silicide layer may be formed in place of the self-aligned metal layer.

EXAMPLE 5

Figure 6A:
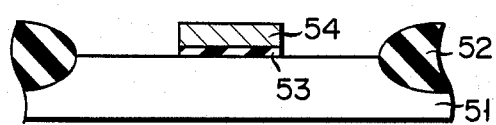
FIGS. 6A to 6G are cross-sectional views of a process of Example 5 according to the present invention.
Figure 6B:
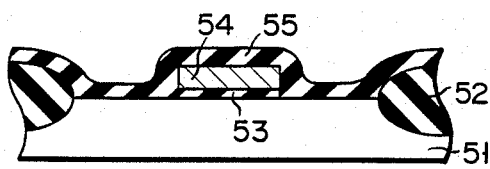
Figure 6C:
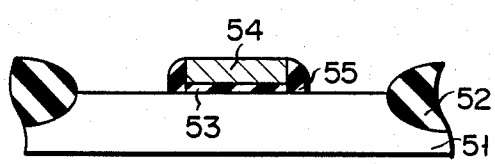

A field oxide film 52, a gate insulating film 53 and a gate polycrystalline silicon layer 54 were sequentially formed on a silicon substrate 51 of p-type in accordance with the conventional process (FIG. 6A). A $SiO_2$ film 55 was formed to cover the wafer to a thickness of about 2,000 Å by the vapor growth method (FIG. 6B). The $SiO_2$ film 55 was etched from the wafer by reactive ion etching or sputtering etching so that the $SiO_2$ film 55 remained on the side walls of the gate polycrystalline silicon layer 54. The surface of a silicon substrate 51 for the prospective regions of the source, drain and diffusion interconnection regions, and the upper surface of the gate polycrystalline silicon layer 54, were exposed (FIG. 6C).

Figure 6D:
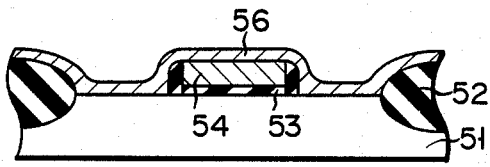
Figure 6E:
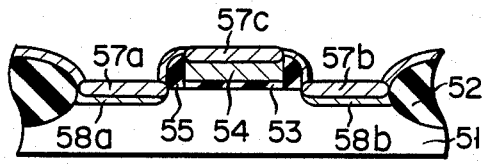

A tungsten film 56 of about 400 Å thickness was formed by vacuum deposition on the entire surface of the wafer (FIG. 6D). As was ion-implanted on the entire surface at a dose of $2 \times 10^{16}$ cm$^{-2}$ and at an acceleration voltage of 300 KeV, and tungsten was reacted with the silicon to form tungsten silicide films 57a, 57b and 57c on the surfaces of the prospective regions for source, drain and diffusion interconnection regions and on the upper surface of the gate polycrystalline silicon layer 54 to a thickness of about 1,200 Å. At the same time, a source region 58a and drain and diffusion interconnection regions 58b were formed on the silicon substrate 51 under the tungsten silicide films 57a and 57b (FIG. 6E). After the unreacted tungsten film was removed, and the $SiO_2$ film 55 was etched from the side walls of the gate, As was ion-implanted at a dose of $1 \times 10^{14}$ cm$^{-2}$ and at an acceleration voltage of 40 KeV to form a shallow p-n junction 60. Then, a structure was obtained on which a self-aligned tungsten silicide film was formed on the surfaces of the source, drain and interconnection region and the upper surface of the gate polycrystalline silicon layer as shown in FIG. 6F.

Figure 6F:
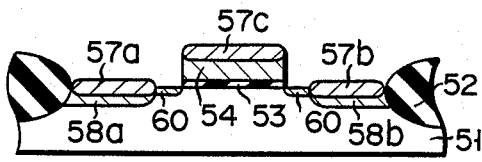
Figure 6G:
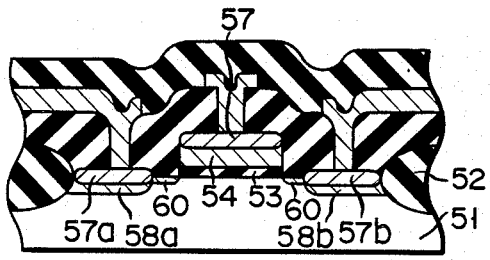

An MOS transistor was obtained, as shown in FIG. 6G, in accordance with the method for manufacturing a conventional MOS transistor.

In the MOS transistor manufactured by the method described above, a tungsten silicide film was formed on the source region, the drain region, the diffusion interconnection region and the gate polycrystalline silicon layer to a thickness of about 1,500 Å. Therefore, the sheet resistivity of the source, drain and diffusion interconnection layer regions and of the gate polycrystalline silicon layer 4 to 5 Ω/□, was much lower than the sheet resistivity of 50 Ω/□ of the diffusion layer formed by the conventional method.

The n-type region which is shallow and has a low impurity concentration need not be specially formed by ion-implantation as shown in FIG. 6F. Instead, if the $SiO_2$ film is made thin in advance, the diffusion in the transverse direction, which was performed by following heating step, may naturally occur.

In Example 5, As was ion-implanted at a high dose of $2 \times 10^{16}$ cm$^{-2}$ so as to change the tungsten film 56 of 400 Å thickness into the tungsten silicide films 57a, 57b and 57c of 1,500 Å thickness by reaction with the silicon. However, the impurity need not be ion-implanted at such a high dose. For example, a low dose such as $5 \times 10^{15}$ cm$^{-2}$ may be used. In this case, the tungsten silicide thin film of about 200 to 300 Å thickness is formed at the interface between the silicon and tungsten. Unlike the conventional method, in which a high temperature of 1,000° to 1,100° C. is required, when the wafer is annealed in an $N_2$ atmosphere at a temperature of 800° C. for about 1 hour to change the remaining tungsten to tungsten silicide, the whole thickness of the tungsten film reacts very easily with silicon to form silicide. The thin native oxide film which is present in the interface between the tungsten and silicon is destroyed by the ion-implantation and the tungsten silicide film is formed; thus, there is no obstacle such as an oxide film which prevents the formation of the tungsten silicide film. Therefore, a low resistance layer having a shallow Xj is formed. Annealing with a CW laser or an electron beam may be performed instead of thermal annealing at a temperature of 800° C.

EXAMPLE 6

Figure 7A:
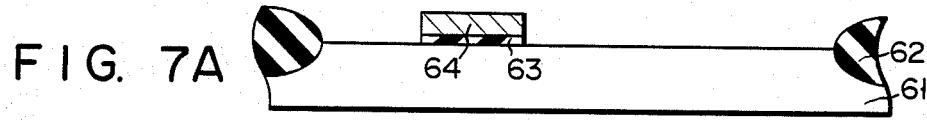
FIGS. 7A to 7G are cross-sectional views of a process of Example 6 according to the present invention.
Figure 7B:
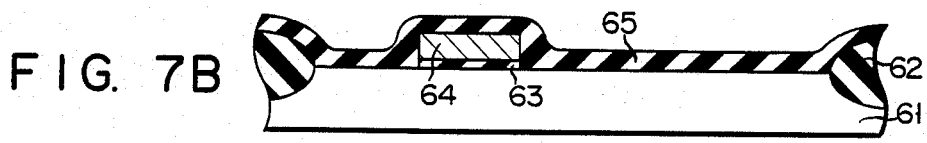
Figure 7C:
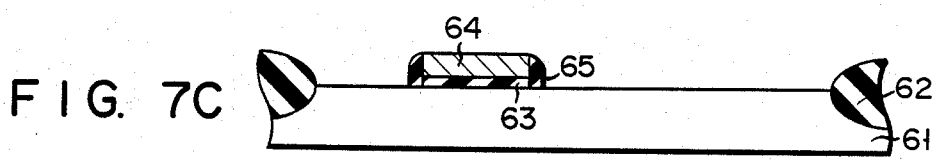

A field oxide film 62, a gate insulating film 63 and a phosphorus-doped gate polycrystalline silicon layer 64 were sequentially formed on a silicon substrate 61 of p-type, in this case, in accordance with the conventional method for manufacturing the MOS transistor (FIG. 7A). An $SiO_2$ film 65 was deposited to cover the wafer to a thickness of about 2,000 Å by the vapor growth method (FIG. 7B). When the $SiO_2$ film 65 was etched over the entire surface of the wafer by reactive ion etching or sputtering etching, the $SiO_2$ film 65 remained only on the side walls of the gate polycrystalline silicon layer 64 so that the surfaces of prospective source, drain and diffusion interconnection layer regions and the upper surface of the gate polycrystalline silicon layer 64 were exposed (FIG. 7C).

Figure 7D:
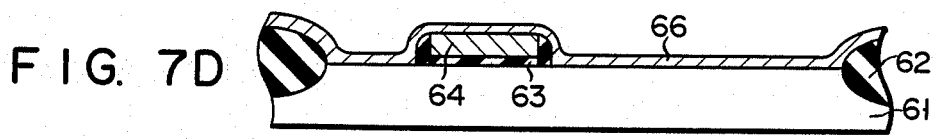
Figure 7E:
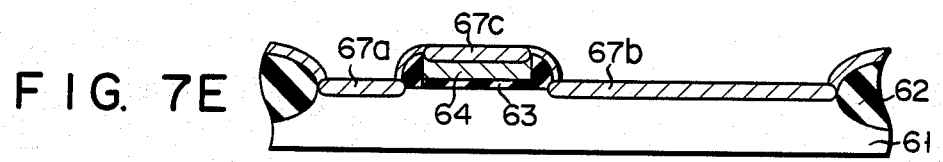
Figure 7F:
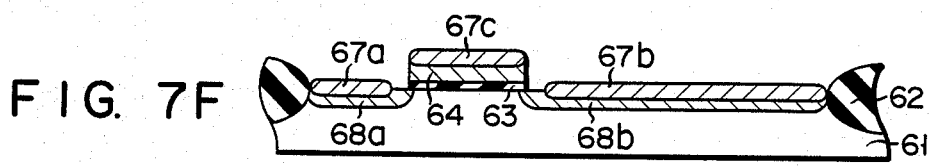
Figure 7G:
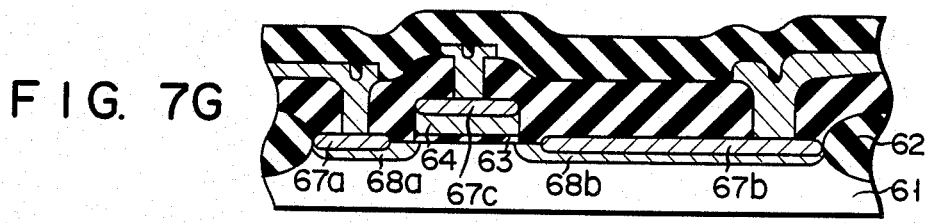

A tungsten film 66 was deposited, to cover the wafer to a thickness of about 400 Å by vacuum deposition (FIG. 7D). When the wafer was annealed at a temperature of 1,000° C., for 30 minutes in this case, a reaction occurred at the interface between tungsten and silicon to form tungsten silicide films 67a, 67b and 67c (FIG. 7E). The tungsten film which remained unreacted was removed. Further, the $SiO_2$ film which was deposited on the side walls of the gate electrode 64 was eliminated. An impurity, As in this case, was then ion-implanted in the entire surface at a dose of $1 \times 10^{14}$ cm$^{-2}$ and at an acceleration energy of about 300 KeV. In this manner, a source region 68a, and drain and diffusion interconnection regions 68b were respectively formed. An MOS type LSI was manufactured in accordance with the conventional process, as shown in FIG. 7G.

According to the process in Example 6, ion-implantation was performed after the metal silicide films 67a, 67b and 67c were formed, so that problems were eliminated such as the exposed surface of the silicon substrate 61 being contaminated by carbon and the formation of the tungsten silicide film being influenced thereby. Furthermore, the ion-implantation was performed after annealing was completed for forming the tungsten silicide film, so that the problem of As diffusing into the channel region to increase the short channel effect was eliminated. Other effects are the same as in Example 1. In this example also, the self-aligned metal layer forming step may be performed in place of the self-aligned metal silicide layer forming step.

EXAMPLE 7

Figure 8:
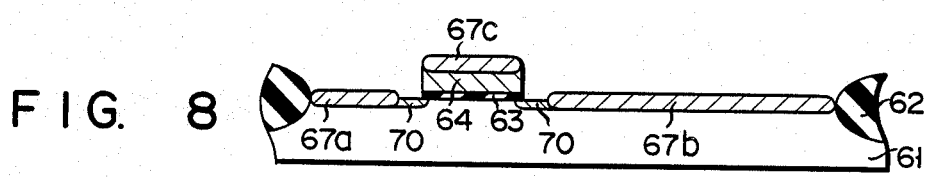
FIG. 8 is a cross-sectional view of a process of Example 7 according to the present invention.

The same process in FIGS. 7A to 7E of Example 6 was repeated for Example 7. After the $SiO_2$ film was eliminated from the side walls of the gate electrode 4, As was ion-implanted at an acceleration voltage of 50 KeV. The state after the ion-implantation is shown in FIG. 8. As was ion-implanted into the silicon substrate 61 in the vicinity of both ends of the gate insulating film 63. In this case, since the tungsten silicide films 67a, 67b and the silicon substrate 61 were insulated by the Schottky barrier, the same effects obtained in the examples described above were obtained. The metal silicide films 67a and 67b function as part of the source, drain add diffusion interconnection regions, and impurity region 70 become part of the source and drain. In this example, the self-aligned metal layer forming step may be performed instead of the self-aligned metal silicide layer forming step.

What is claimed is:

1. A method for manufactoring a semiconductor device, comprising the steps of:
   (a) forming a gate insulating film on a surface of a silicon substrate, and a gate electrode on said gate insulation film;
   (b) forming a source region and a drain region by doping said substrate with an impurity which has a conductivity type opposite to a conductivity type of said silicon substrate;
   (c) forming an insulating layer on said substrate and etching the insulating layer by an anistropic etching thus leaving the self-aligned insulating layer on the side walls of said gate electrode;
   (d) forming a self-aligned metal layer on a region on which an insulating film is not formed, said region including said source region and said drain region; and
   (e) forming electrodes which are connected to the source region, drain region and gate electrode.

2. A method according to claim 1, wherein said anisotropic etching method is reactive ion etching or sputtering etching.

3. A method according to claim 2, further including the step of etching a surface of said silicon substrate which is exposed by the anisotropic etching method.

4. A method according to claim 1, further including the step of performing phosphorus gettering in an atmosphere at high temperature containing phosphorus, after said insulating film is formed to cover the entire surface of the substrate.

5. A method according to claim 1, wherein said gate electrode is a polycrystalline silicon layer in which an impurity of high concentraiton is doped, and step (c) includes oxidation in a wet or stream atmosphere, etching, and leaving an oxide film only on the side surface of said gate electrode.

6. A method according to claim 1, wherein step (d) includes the steps of heating said silicon substrate at a temperature lower than a temperature for forming an alloy of the silicon and metal, surrounding said silicon substrate with a metal halide gas and a reducing gas, and depositing a metal film on the exposed surface of said silicon substrate.

7. A method according to claim 1, wherein the metal is a member selected from the group consisting of W, Pd, Pt, Ni, Mo, Nd and Ta.

8. A method according to claim 1, further comprising the steps of doping said substrate with an impurity which has a conductivity type opposite to a conductivity type of said silicon substrate at a dose higher than that in the doping in step (b).

9. A method for manufactoring a semiconductor device, comprising the steps of:
   (a) forming a gate insulating film on a surface of a silicon substrate, and a gate electrode on said gate insulation film;
   (b) forming a source region and a drain region by doping said substrate with an impurity which has a conductivity type opposite to a conductivity type of said silicon substrate;
   (c) forming an insulating layer on said substrate and etching the insulating layer by an anistropic etching thus leaving the self-aligned insulating layer on the side walls of said gate electrode;
   (d) forming a self-aligned metal silicide layer on a region on which an insulating film is not formed, said region including said source region and said drain region; and
   (e) forming electrodes which are connected to the source region, drain region and gate electrode.

* * * * *